(12) United States Patent  
Nakura et al.

(10) Patent No.: US 8,514,607 B2
(45) Date of Patent: Aug. 20, 2013

(54) SEMICONDUCTOR MEMORY DEVICE

(75) Inventors: Mitsuru Nakura, Osaka (JP); Kazuya Ishihara, Osaka (JP); Shinobu Yamazaki, Osaka (JP); Suguru Kawabata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 250 days.

(21) Appl. No.: 13/212,457

(22) Filed: Aug. 18, 2011

(65) Prior Publication Data

US 2012/0075909 A1    Mar. 29, 2012

(30) Foreign Application Priority Data

Sep. 24, 2010 (JP) ................................ 2010-213984

(51) Int. Cl.
    G11C 11/00 (2006.01)
(52) U.S. Cl.
    USPC ......................................... 365/148; 365/158
(58) Field of Classification Search
    USPC ................. 365/48, 55, 62, 66, 74, 78, 80–93,
        365/100, 130, 131, 148, 158, 171–173, 225.5,
        365/243.5; 216/22; 257/421, E21.665; 438/3;
        977/933–935
    See application file for complete search history.

(56) References Cited

U.S. PATENT DOCUMENTS

| | | | |
|---|---|---|---|
| 6,815,744 B1 | 11/2004 | Beck et al. | |
| 7,715,220 B2 | 5/2010 | Tsushima et al. | |
| 7,948,790 B2 * | 5/2011 | Tsukamoto et al. | 365/148 |
| 7,978,497 B2 * | 7/2011 | Maejima | 365/148 |
| 8,068,358 B2 * | 11/2011 | Maejima | 365/148 |
| 8,400,815 B2 * | 3/2013 | Terada et al. | 365/148 |
| 2009/0168495 A1 | 7/2009 | Aoki | |
| 2009/0219750 A1 * | 9/2009 | Tokiwa et al. | 365/148 |
| 2009/0244953 A1 * | 10/2009 | Maejima | 365/148 |
| 2010/0054017 A1 * | 3/2010 | Maejima | 365/148 |
| 2010/0238701 A1 * | 9/2010 | Tsukamoto et al. | 365/148 |
| 2011/0044090 A1 * | 2/2011 | Terada et al. | 365/148 |

FOREIGN PATENT DOCUMENTS

| | | |
|---|---|---|
| JP | 2002-537627 | 11/2002 |
| JP | 2007-328857 | 12/2007 |
| WO | WO 2008/029446 A1 | 3/2008 |

OTHER PUBLICATIONS

H. Pagnia et al., "Bistable Switching in Electroformed Metal-Insulator-Metal Devices", Phys. Stat. Sol. (a), vol. 108, pp. 11-65, 1988.
Baek I.G. et al., "Highly Scalable Non-volatile Resistive Memory using Simple Binary Oxide Driven by Asymmetric Unipolar Voltage Pulses", IEDM2004, pp. 587-590, 2004.

* cited by examiner

Primary Examiner — Harry W Byrne
(74) Attorney, Agent, or Firm — Nixon & Vanderhye, P.C.

(57) ABSTRACT

Provided is a semiconductor memory device that is capable of stably programming with desirable controllability to a desired electric resistance state in a random access programming action and is provided with a variable resistance element. Regardless of a resistance state of a variable resistance element of a memory cell that is a target of a writing action (erasing and programming actions), an erasing voltage pulse for bringing the resistance state of the variable resistance element to an erased state having a lowest resistance value is applied. Thereafter, a programming voltage pulse for bringing the resistance state of the variable resistance element to a desired programmed state is applied to the variable resistance element of the programming action target memory cell. By always applying the programming voltage pulse after having applied the erasing voltage pulse, a plurality of programming voltage pulses being sequentially applied can be avoided.

7 Claims, 12 Drawing Sheets

SEMICONDUCTOR MEMORY DEVICE

CROSS REFERENCE TO RELATED APPLICATION

This Nonprofisional application claims priority under 35 U.S.C. §119(a) on Patent Application No. 2010-213984 filed in Japan on Sep. 24, 2010 the entire contents of which are hereby incorporated by reference.

BACKGROUND OF THE INVENTION

1. Field of the Invention

The present invention relates to a semiconductor memory device including a memory cell array configured of memory cells, a plurality of which is arranged respectively in a row direction and a column direction, each memory cell including a variable resistance element that stores information based on an electric operational property in which an electric resistance changes by application of electric stress.

2. Description of the Related Art

A non-volatile memory represented by a flash memory is used as a large-capacity and compact information storing medium in various fields such as computers, communications, measuring appliances, automatic controllers and living appliances used around a user, and a demand for a non-volatile memory that is cheaper and has larger capacity is extremely large. This is because it can perform a function as a memory card that can easily be carried around, or data storage or a program storage, etc. that stores initial settings for device operation such as a cell phone in a non-volatile manner, due to being capable of being electrically written and that data is not erased even when the power is turned off.

Note that, since the flash memory requires longer time for an erasing action of erasing data to a logical value "0" compared to a programming action of programming data to a logical value "1", it is not capable of high-speed operation. In regard to the erasing action, when the erasing action is performed, although improvement in speed is attempted by performing in a unit of a few bytes or a block unit, there is a problem that a random access programming cannot be performed since the erasing action is performed in the unit of the few bytes/block unit.

Due to this, currently a new type of non-volatile memory that replaces the flash memory is being widely studied. Among such, a resistance change memory that uses a phenomenon in which a resistance change occurs due to application of a voltage to a metal oxide film is useful compared to the flash memory in regards to a scaling limit, and since it is capable of a high-speed data writing, it is frequently researched and developed in the recent years (e.g., refer to Japanese Unexamined Patent Application Publication (Translation of PCT Application) No. 2002-537627, or H. Pagnia et al., "Bistable Switching in Electroformed Metal-Insulator-Metal Devices", Phys. Stat. Sol. (a), vol. 108, pp. 11-65, 1988, and Baek I. G. et al., "Highly Scalable Nonvolatile Resistive Memory using Simple Binary Oxide Driven by Asymmetric Unipolar Voltage Pulses", IEDM2004, pp. 587-590, 2004).

As programming/erasing properties of such a variable resistance element having the metal oxide, in a case with a driving method called bipolar switching, since the electric resistance of an element increases (high resistance state)/ decreases (low resistance state) by applying voltage pulses with opposite polarity respectively to the element, it can be used as a memory by assigning a logical value as data to each electric resistance state.

As a feature of the variable resistance element having the metal oxide, it is capable of the high-speed random access programming/erasing.

SUMMARY OF THE INVENTION

For example, a case in which the random access programming/erasing is performed on the variable resistance element that stores two values of "0" and "1" will be considered. In performing the programming/erasing action regardless of the resistance state of the memory cell, an erasing action applying an erasing voltage pulse to the element in a programmed state or a programming action applying a programming voltage pulse to the element in an erased state will be appropriate actions, however, a programming action applying the programming voltage pulse to the element already in the programmed state or an erasing action applying the erasing voltage pulse to the element already in the erased state will be overwriting to the original states.

Property variability of the elements is likely to be influenced by such an operation hysteresis, and depending on the resistance state, there is a possibility that data is written due to a change in the electric resistance by the overwriting being performed. Further, when the operation hysteresis of the elements is large, the property variability between elements becomes larger, and becomes a cause of data errors.

In actually using the variable resistance elements as a memory, since there is a possibility that a programming action failure occurs due to the variability in the element properties or a variability in application voltages or application currents in the programming action, a verifying action of verifying whether or not the resistance property of the variable resistance element to which the writing action had been performed has shifted to a desired resistance distribution range will be necessary. Then, as a result of having performed the verifying action, if the programming action failure actually occurs, the programming action needs to be performed by applying the writing voltage pulse again so that the resistance property of the variable resistance element is brought to be within the desired resistance distribution range.

However, when the voltage pulse for the programming action is applied again to the variable resistance element whose resistance property is not within the resistance distribution range of the correct resistance state, since the programming action is overwriting for the variable resistance element, it cannot be programmed to the desired resistance distribution range by the electric resistance being lowered.

On the other hand, the programming property of a variable resistance element represented by a metal oxide variable resistance element exhibits a resistance hysteresis curve as in FIG. 12. FIG. 12 is a diagram showing a relationship between an absolute value of the programming voltage pulse applied to the variable resistance element and the resistance value after a change caused by the voltage pulse. As shown in FIG. 12, the resistance value increases accompanying the increase in the application voltage up to a certain programming voltage, however, the resistance value decreases accompanying the increase in the application voltage thereafter.

Accordingly, the electric resistance value greatly changes after the programming by the programming voltage applied to the variable resistance element, and for some variable resistance elements, a subtle difference in the application voltage gives rise to a great difference in the electric resistance. This applies not only to the applied programming voltages but also to applied programming currents, and the resistance value after the programming greatly changes depending on the magnitude of the applied programming currents.

As shown in FIG. 12, although the electric resistance after the writing action does not rise up to a peak value when the application voltage is low, the electric resistance is decreased when the application voltage is too high. The peak value of the electric resistance and the application voltage by which the electric resistance value is brought to its peak have element variability among the respective variable resistance elements, and even if the application voltage pulse is identical, since the variability in the voltage that is actually applied occurs for each element e.g. due to the position of the variable resistance elements within the memory cell array, it becomes difficult to program such that the resistance property after the application of the voltage pulse is brought to be within the desired resistance distribution range.

In view of the above conventional problem, an object of the present invention is to provide a semiconductor memory device capable of stably programming to a desired electric resistance state regardless of a resistance state of a memory cell in a random access programming action.

In order to achieve the above object, the semiconductor memory device according to the present invention has a first feature of including a memory cell array configured of memory cells. A plurality of memory cells is arranged respectively in a row direction and a column direction. Each memory cell includes a variable resistance element in which an electrode is supported at each of two terminals of a variable resistor, a resistance state is defined by a resistance property between the two terminals and transitions between two or more different resistance states by applying electric stress between the two terminals, and one resistance state after the transition is used for storing information. In a random writing of one or more selected memory cells in the memory cell array, either an erasing action or a programming action is performed on each of the selected memory cells. In the erasing action, an erasing voltage pulse for transitioning the resistance states of the variable resistance elements of the selected memory cells to an erased state having a lowest resistance value is applied to the selected memory cells, regardless of the resistance states of the variable resistance elements of the selected memory cells. In the programming action, the erasing voltage pulse is applied to the selected memory cells, and a first programming voltage pulse for transitioning the resistance states of the variable resistance elements of the selected memory cells from the erased state to a predetermined resistance state is applied to the selected memory cells, regardless of the resistance states of the variable resistance elements of the selected memory cells.

Further, the semiconductor memory device according to the present invention has a second feature, in addition to the first feature, that an initial verifying action of reading the resistance states of the variable resistance elements of the selected memory cells is not performed prior to performing the erasing action or the programming action.

According to the semiconductor memory device of the above first or second feature, in the programming (increasing the resistance) of the selected memory cells, the erasing voltage pulse is applied to cause the transition to the resistance state with the lowest resistance regardless of the resistance states of the variable resistance elements of the memory cells, and thereafter, the programming voltage pulse is applied to cause the transition to the high resistance state. Further, in the erasing (decreasing the resistance) of the selected memory cells also, the erasing voltage pulse is applied to cause the transition to the low resistance state regardless of the resistance states of the variable resistance elements of the memory cells.

Although details will be described later, the variable resistance element that uses metal oxide as the variable resistor has an undesirable property that the resistance value after application of a pulse decreases when the programming voltage pulse for bring the memory cell to an even higher resistance state is applied to a memory cell that is in the highest resistance state. On the other hand, even when the erasing voltage pulse for bring the memory cell to an even lower resistance state is applied to a memory cell that is in the lowest resistance state, the resistance value after the application of the pulse hardly changes.

This means that the variable resistance elements significantly receives the influence of the overwriting with respect to the application of the programming voltage pulse (hereinafter occasionally referred to as a "program overwriting"), whereas they have durability against the overwriting with respect to the application of the erasing voltage pulse (hereinafter occasionally referred to as an "erasure overwriting"). By utilizing this feature, the present invention can realize programming and erasing actions that can easily be controlled to bring the resistance property of the resistance state to the desired distribution range.

In the present invention, the erasing voltage pulse is applied to the writing target memory cell regardless of the resistance state before the application of the pulse. Due to this, in the case where the resistance state before the application of the pulse is in the resistance state with the lowest resistance (erased state), the erasing voltage pulse will be applied to the variable resistance element in the erased state, however, as described above, since the variable resistance element have the durability against the erasure overwriting, the resistance property that is in the low resistance state will not be brought to be a high resistance, and the resistance property is maintained within the distribution range of the desired low resistance state. Further, in the case of bringing the same to the high resistance state (programmed state), since the programming action is performed by always applying the programming voltage pulse after having applied the erasing pulse, the occurrence of the program overwriting is avoided, and a stable programming and erasing actions can be realized.

Further, since the wiring is performed by applying the erasing voltage pulse regardless of the resistance state of the variable resistance element before the application of the pulse, the initial verifying action of reading the resistance state of the variable resistance element before the application of the pulse becomes unnecessary.

Further, the semiconductor memory device according to the present invention has a third feature, in addition to any of the above features, of further including a verification section that performs, after having performed the programming action, a verifying action of verifying whether or not the resistance properties of the variable resistance elements of the selected memory cells are within a resistance distribution range of the predetermined resistance state. In the verifying action, in a case where the memory cell of which the resistance property of the variable resistance element is outside the resistance distribution range of the predetermined resistance state is detected among the selected memory cells, a second programming action is repeatedly performed until the resistance property of the variable resistance element of the memory cell that is outside the resistance distribution range is brought to be within the resistance distribution range of the predetermined resistance state, and in the second programming action, the erasing voltage pulse is applied to the memory cell and a second programming voltage pulse for transitioning the resistance state of the variable resistance element of the memory cell that is outside the resistance distribution range from the erased state to the predetermined resistance state is applied to the memory cell, regardless of the resistance state of the variable resistance element of the memory cell that is outside the resistance distribution range.

According to the semiconductor memory device of the above third feature, even in the case of performing the programming again on the memory cells whose resistance properties are not within the desired resistance range due to a programming action failure after the programming action, since the reprogramming is performed by applying the writing voltage pulse after having applied the erasing voltage pulse, the occurrence of the program overwriting is avoided, and the programming action failure can be suppressed.

Further, the semiconductor memory device according to the present invention has a fourth feature, in addition to the third feature, that in the case where the second programming action is repeated for a plurality of times, in the second programming action for a first time, the second programming voltage pulse is set to have a smaller absolute value of a voltage amplitude than that of the first programming voltage pulse, or to have a smaller amount of current flowing in the variable resistance element when the second programming voltage pulse is applied than when the first programming voltage pulse is applied. In the second programming action for second and subsequent times, the absolute value of the voltage amplitude of the second programming voltage pulse or the amount of current flowing in the variable resistance element when the second programming voltage pulse is applied is increased in steps as a number of times the second programming action is performed increases.

According to the semiconductor memory device of the above fourth feature, it becomes possible to program the resistance properties to the desired resistance range with desirable controllability by taking the element variability of the variable resistance elements, or the positions of the variable resistance elements within the array, into consideration.

Further, the semiconductor memory device according to the present invention has a fifth feature, in addition to any of the above features, that each of the memory cells includes a current controlling element connected to the electrode on one terminal of the variable resistor of the variable resistance element, and the current controlling element is a transistor having either a source or a drain connected to the electrode on the one terminal of the variable resistor.

Further, the semiconductor memory device according to the present invention has a sixth feature, in addition to any one of the first to fourth features, that each of the memory cells includes a current controlling element connected to the electrode on one terminal of the variable resistor of the variable resistance element, and the current controlling element is a diode element having either an anode or a cathode connected to the electrode on the one terminal of the variable resistor.

Further, the semiconductor memory device according to the present invention has a seventh feature, in addition to any of the above features, that the variable resistor is configured by including a metal oxide or oxynitride of at least one of Al, Hf, Ni, Co, Ta, Zr, W, Ti, Cu, V, Zn and Nb.

Therefore, according to the present invention, in the writing of the selected memory cells, by always applying the programming voltage pulse after having applied the erasing voltage pulse and having caused the transition to the low resistance state regardless of the resistance states of the variable resistance elements of the memory cells, a semiconductor memory device that is capable of performing programming to a distribution range of the desired resistance property with the desirable controllability is realized.

DESCRIPTION OF THE PREFERRED EMBODIMENTS

[First Embodiment]

Figure 1:
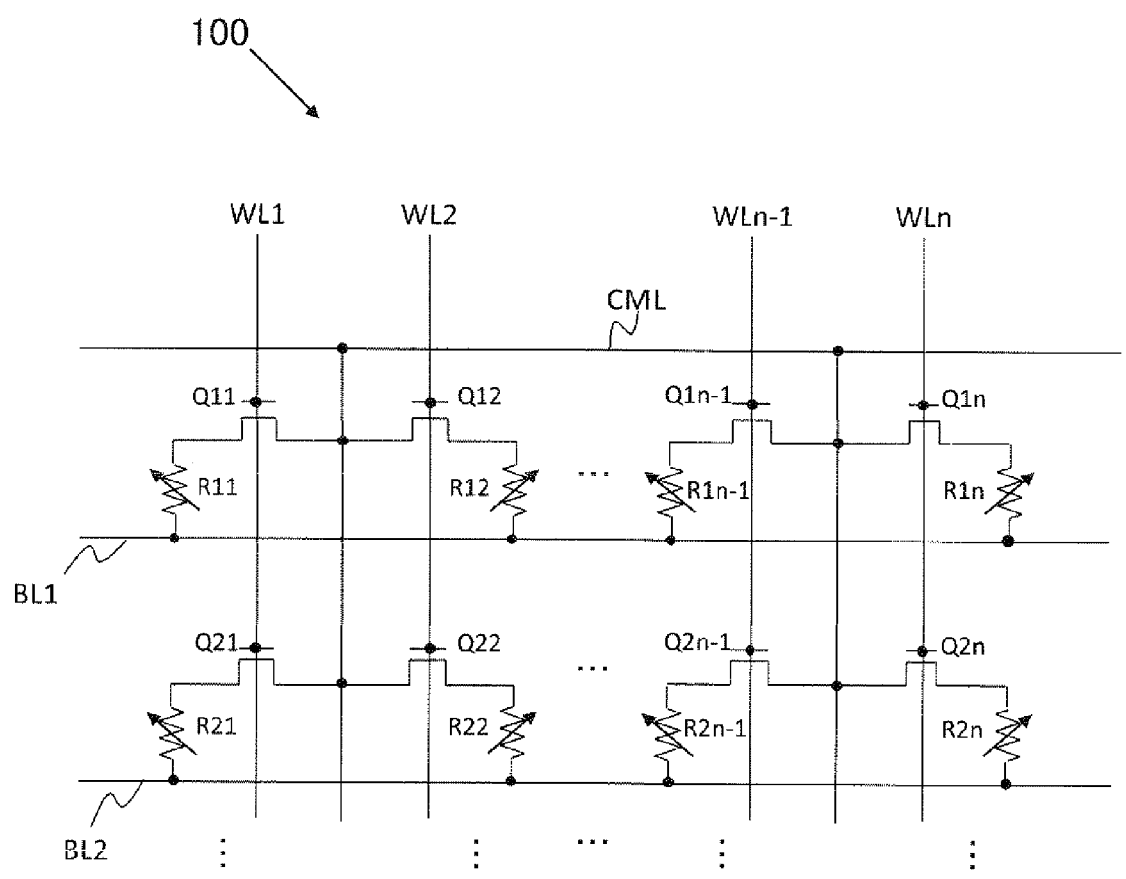
FIG. 1 is a diagram showing a configurational example of a memory cell array including variable resistance elements.

A configurational example of a memory cell array of a semiconductor memory device according to an embodiment of the present invention (hereinafter occasionally referred to as "the device of the present invention") is shown in a memory cell array 100 in FIG. 1. As shown in FIG. 1, the memory cell array 100 is formed by arranging 1T1R type memory cells, each formed of a variable resistance element R (R11 to R1*n*, R21 to R2*n*, . . . ) and a transistor Q (Q11 to Q1*n*, Q21 to Q2*n*, . . . ) that is a current controlling element, respectively in a row direction (vertical direction of FIG. 1) and a column direction (lateral direction of FIG. 1) in a matrix.

For each memory cell, one terminal of the variable resistance element and one terminal of a source or a drain of the transistor are connected, and further, other ends of the variable resistance elements of the memory cells arranged in the same column are respectively connected to bit lines BL1, BL2, ... extending in the column direction; other ends of the sources or the drains of the transistors of the memory cells arranged in the same column are connected to a common line CML that is common for all memory cells, and gates of the transistors of the memory cells arranged in the same row are respectively connected to word lines WL1 to WLn extending in the row direction. As for the common line CML, all of the common lines CML in the memory cell array may be used commonly, or may configure separate common lines extending in the column or row direction; a configuration thereof is not especially limited. Further, the memory cell array 100 of the device of the present invention is not limited to the equivalent circuit shown in FIG. 1, and the present invention is not limited in regards to its circuit configuration so long as the memory cells including the variable resistance elements and the current controlling elements are connected respectively using the bit lines and the word lines to form a memory cell array. Further, the present embodiment connects the one terminal of the variable resistance element not connecting with the transistor to the bit line, however, it may have a configuration in which the one terminal of the variable resistance element not connecting with the transistor is connected to the common line.

As a material for a variable resistor used as a metal oxide variable resistance element, in addition to Hf oxide, e.g., Hf oxynitride, or respective metal oxides or oxynitrides of Al, Ni, Co, Ta, Zr, W, Ti, Cu, V, Zn and Nb may be exemplified.

Further, as materials for electrodes to support the metal oxide, one of the electrodes can be materialized as a first electrode by using those with a large work function (e.g., TiN, Pt, Ir, etc.), and the other of the electrodes can be materialized as a second electrode by using those with the work function that is about the same level as the Fermi level of the metal oxide (e.g., Ta, Al, etc.). At this time, interfaces of the electrodes and the metal oxide come to be in an ohmic contact on a second electrode side, and a non-ohmic contact (Schottky barrier junction) on a first electrode side. When the programming action is to be performed, a positive bias is applied from the first electrode side, and when the erasing action is to be performed, the positive bias is applied from the second electrode side.

Here, with respect to the resistance state of the variable resistance elements, an action of writing the high resistance state to the low resistance state (erased state) is referred to as the erasing action, and an action of writing the low resistance state to the high resistance state (programmed state) is referred to as the programming action. Further, the erasing action and the programming action are collectively referred to as a writing action.

As for the metal oxide variable resistance element, the resistance state of the variable resistance element after the programming or erasing action transitions between two or more resistance states by controlling the voltage or current applied to the variable resistance element when the programming or erasing action is performed; whereas different information can be assigned to the respective resistance states by the variable resistance element having the low resistance state (erased state) with the lowest resistance and one or more resistance states (programmed state) with larger resistance value than the low resistance state; and information with two or more values can respectively be stored for the variable resistance element in each memory cell. Especially, by using variable resistance element having a plurality of programmed states and capable of storing three or more values, it becomes possible to store multivalued information.

At this time, the writing of the resistance state of the variable resistance element can be performed by controlling the application voltage or current, and since there is no need to adjust the number of times and duration of application of the voltage pulse applied to the variable resistance element each time different information is stored, a complicated algorithm is not necessary.

The memory cell array 100 is connected to a word line decoder (not shown) for the word lines WL1 to WLn to select a column of the memory cells that are the target of a memory action such as reading, programming, or erasing, etc., and is connected to a bit line decoder (not shown) for the bit lines BL1, BL2, ... to select a row of the memory cells that are the target of the memory action. Further, the device of the present invention is configured by including a voltage applying circuit for generating the voltage to be applied to the respective word lines and the respective bit lines upon a memory action and supplying the same to the memory cells that are the target of the memory action via the bit line decoder or the word line decoder, a reading circuit for detecting resistance in the variable resistance elements of the memory cells, and a control circuit. Note that, various types of well-known configurations can be used for the word line decoder, the bit line decoder, the voltage applying circuit, the reading circuit and the control circuit; and since they deviate from the essence of the present invention, the detailed description therefor will be omitted.

Further, the reading circuit and the control circuit serve a role as a verification section for verifying whether or not the resistance properties of the variable resistance elements in the memory cells that are the programming target are within the desired resistance distribution range in the programming action.

Next, the writing action on the memory cells in the present embodiment will be described. Note that, in the present embodiment, a description will be given in detail of a variable resistance element having two resistance states of the low resistance state and the high resistance state and a binary bipolar operation property of transitioning between the respective resistance states by the application of voltage pulses with different polarity.

Figure 2:
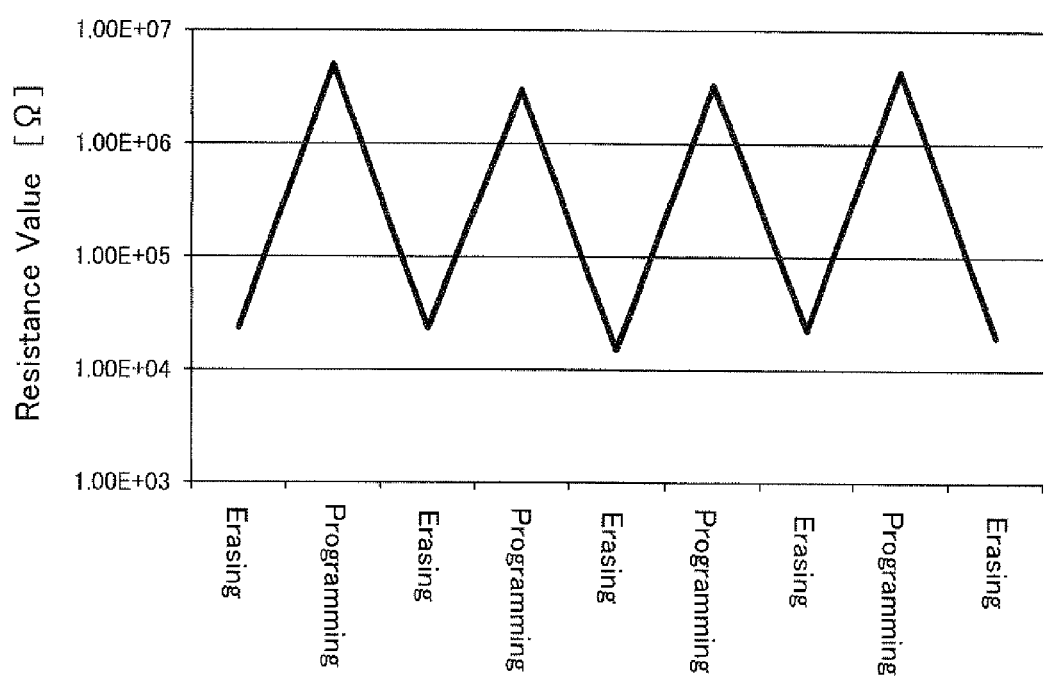
FIG. 2 is a diagram showing a switching property of the variable resistance elements used in a verification of an effect of the present invention.

FIG. 2 shows a transition of a resistance value of a variable resistance element R in which hafnium oxide (HfOx) of 3 nm is deposited on titanium nitride (TiN) as the lower electrode configuring one terminal of the variable resistance element, and tantalum (Ta) as the upper electrode that is to be the other terminal of the variable resistance element is stacked thereon, when the erasing action and the programming action are alternately repeated.

As shown in FIG. 2, when a voltage pulse of 1.6 V, 50 nsec e.g. with an upper electrode side as a reference is applied as the programming voltage pulse on the lower electrode, the variable resistance element R transitions to the programmed state with high resistance (resistance value: 5 MΩ), and when a voltage pulse of 1.8 V, 50 nsec e.g. with the lower electrode side as the reference is applied as the erasing voltage pulse on the ripper electrode, the variable resistance element R transitions to the erased state with low resistance (resistance value: 20 kΩ). Note that the reading of the resistance value is performed by applying voltage of 0.5 V between the electrodes. Accordingly, in the case of alternately applying the erasing voltage pulse and the programming voltage pulse, the variable resistance element transitions from one to another between the erased state (low resistance state) and the programmed state (high resistance state) by the application of the respective voltage pulses, and exhibits a favorable switching property.

Figure 3:
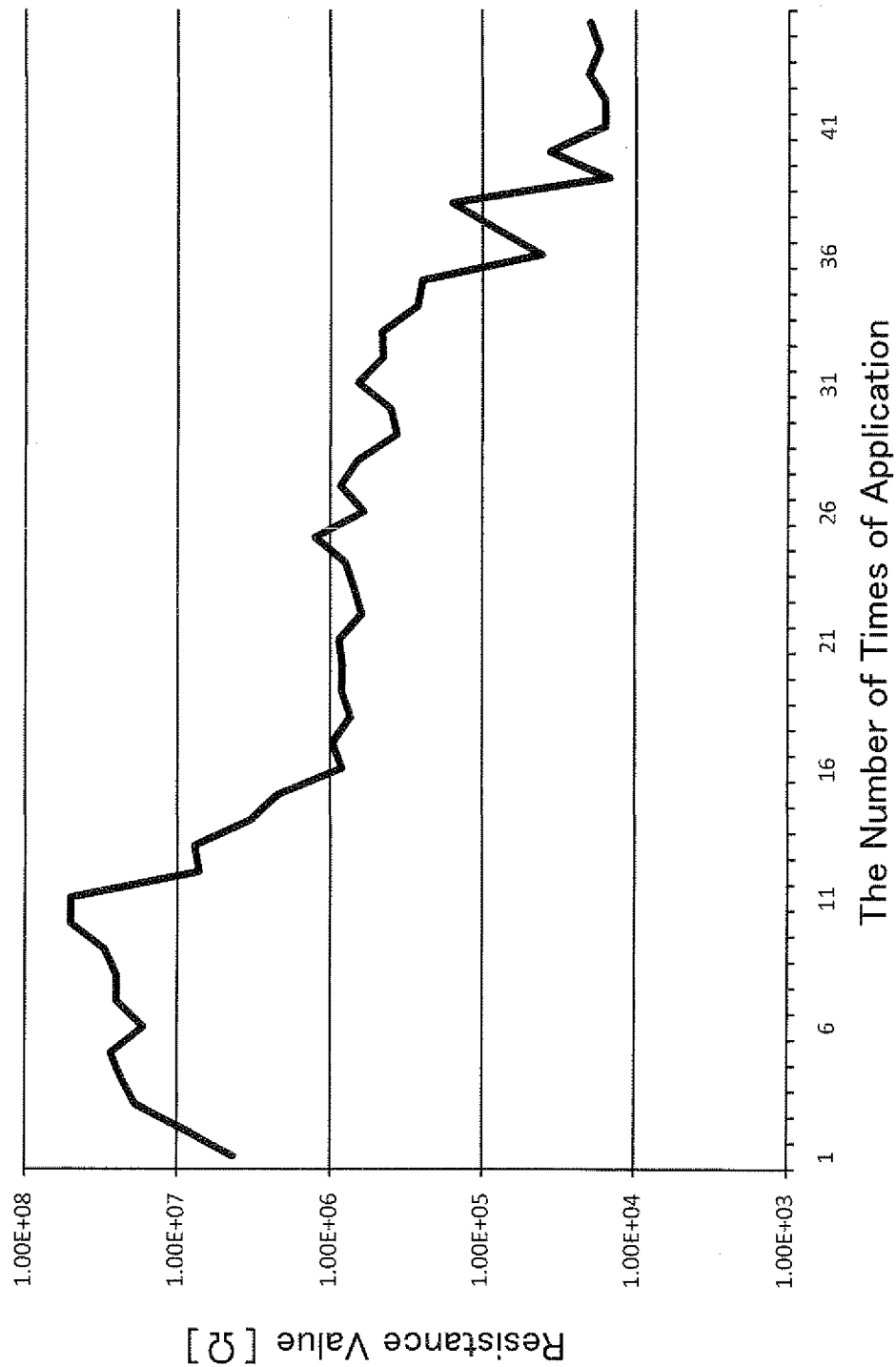
FIG. 3 is a diagram showing a program overwriting durability of the variable resistance elements used in the verification of the effect of the present invention.

Meanwhile, FIG. 3 shows the transition of the resistance value of the variable resistance element R in the case of further applying the programming voltage pulse sequentially in the high resistance programmed state as a result of the program overwriting. As shown in FIG. 3, since the resistance value of the variable resistance element R after the programming action gradually decreases by repeating the program overwriting, when the programming action is performed sequentially for more than forty times, it becomes difficult to distinctively read the programmed state and the low resistance erased state.

Figure 4:
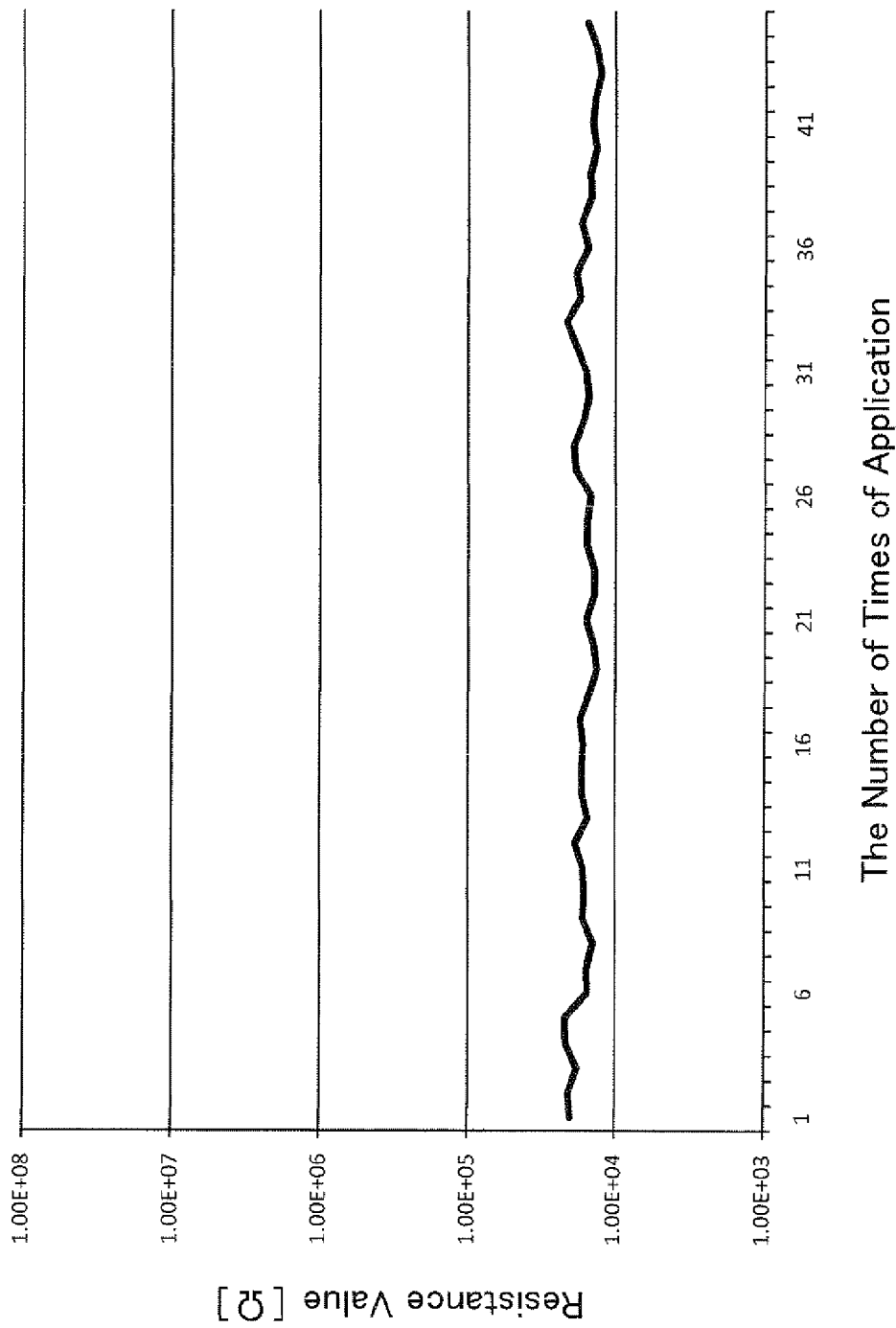
FIG. 4 is a diagram showing an erasure overwriting durability of the variable resistance elements used in the verification of the effect of the present invention.

On the other hand, FIG. 4 shows the transition of the resistance value of the variable resistance element R in the case of further applying the erasing voltage pulse sequentially in the low resistance erased state as a result of the erasure overwriting. As shown in FIG. 4, it can be seen that even when the erasure overwriting is repeated, the resistance value of the variable resistance element R after the erasing action maintains substantially a constant value without fluctuation thereof. That is, it can be said that the variable resistance element. R has durability against the erasure overwriting.

Figure 5:
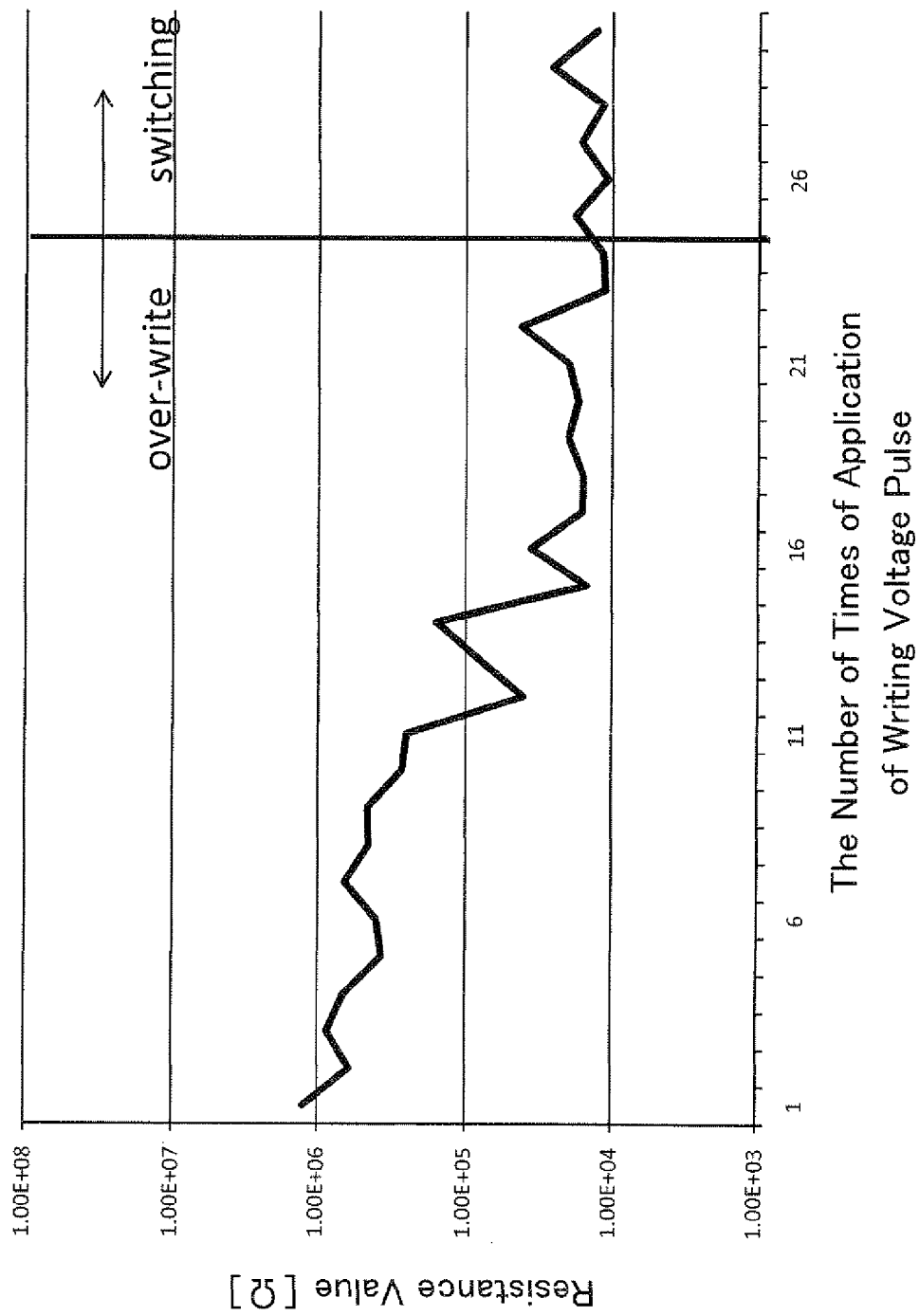
FIG. 5 is a diagram showing the switching property of the variable resistance elements used in the verification of the effect of the present invention, in a case where after programming voltage pulse is sequentially applied for plural times, an erasing voltage pulse and the programming voltage pulse are alternately applied for plural times.

Further, FIG. 5 shows the transition of the resistance value of the variable resistance element R in the case of alternately applying the erasing voltage pulse and the programming voltage pulse after having applied the programming voltage pulse sequentially to the variable resistance element R in the programmed state thereby continuing to perform the program overwriting. As shown in FIG. 5, when the programming action is further performed sequentially on the variable resistance element in the programmed state, the resistance value gradually decreases, the resistance value that is supposed to be a high resistance in a normal condition does not increase efficiently even when the erasing action and the programming action are alternately performed thereafter, and thus a normal writing action cannot be performed.

Figure 6:
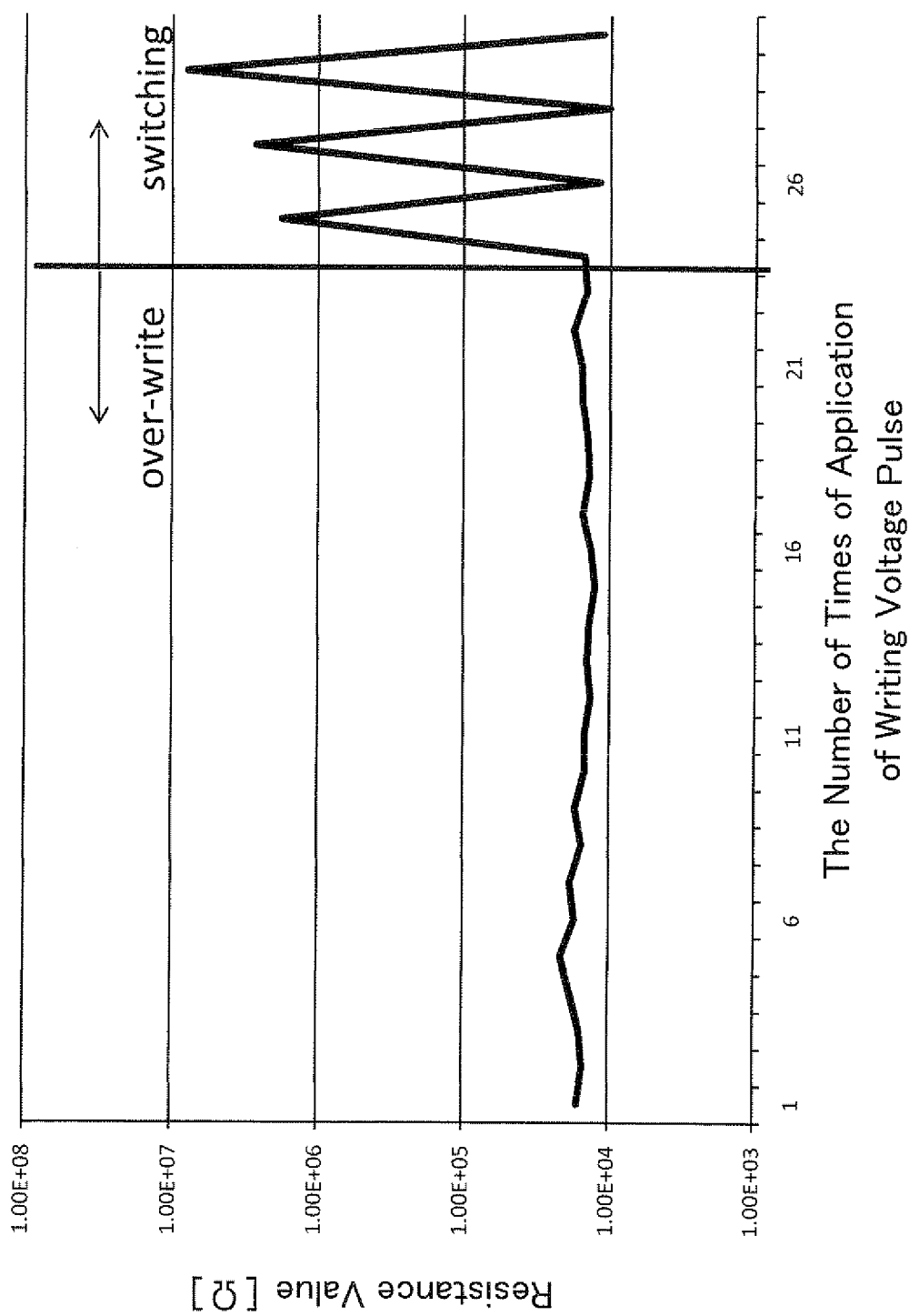
FIG. 6 is a diagram showing the switching property of the variable resistance elements used in the verification of the effect of the present invention, in a case where after erasing voltage pulse is sequentially applied for plural times, the programming voltage pulse and the erasing voltage pulse are alternately applied for plural times.

On the other hand, FIG. 6 shows the transition of the resistance value of the variable resistance element R in the case of alternately applying the programming voltage pulse and the erasing voltage pulse after having applied the erasing voltage pulse sequentially to the variable resistance element R in the erased state thereby continuing to perform the erasure overwriting. As shown in FIG. 6, even when the erasing action is further performed sequentially on the variable resistance element in the erased state thereby continuing to perform the erasure overwriting, a normal writing action can be performed in the writing action thereafter.

Figure 7:
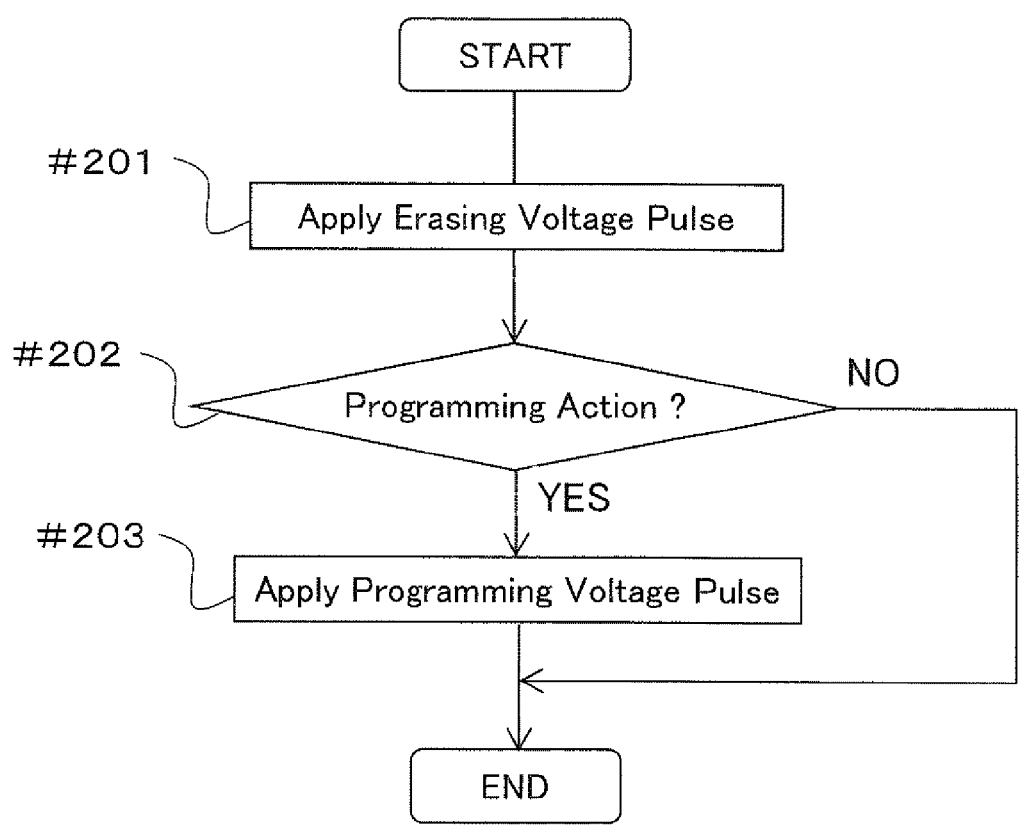
FIG. 7 is a flowchart showing a method of a writing action according to a first embodiment of the present invention.

Thus, upon performing the writing action (programming action and erasing action) of the variable resistance element R, the problems of the decrease in the resistance value due to the program overwriting or the writing action failure can be avoided by causing operations as below. FIG. 7 shows a flowchart of the writing action according to the present invention.

(1) When the writing action is to be performed, whether the resistance state of the writing target variable resistance element just before performing the writing action is in the programmed state or the erased state, regardless of the resistance state of the variable resistance element, the erasing voltage pulse is once applied to cause it to transition to the erased state (step #201).

(2) Thereafter, in the case with the programming action (YES in the divergence of step #202), the programming voltage pulse (first programming voltage pulse) is applied to cause the resistance state of the programming target variable resistance element to transition from the erased state to the programmed state (step #203).

At this time, in step #201, upon applying the erasing voltage pulse, the erasing voltage pulse may be applied collectively to all of the writing target variable resistance elements, or the erasing voltage pulse may be applied independently by sequentially selecting a writing target variable resistance element. Alternatively, the erasing voltage pulse may be applied collectively by selecting the writing target variable resistance elements for every word line or bit line.

Due to this, upon performing the erasing action by selecting memory cells in the array in random order, if the erasing target variable resistance element is in the programmed state, the programmed state is brought to the erased state by the application of the erasing voltage pulse, so that the erasing action is normally performed. On the other hand, if the erasing target variable resistance element is in the erased state, the erased state is brought to the erased state by the application of the erasing voltage pulse and the erasure overwriting occurs, however, as described in FIG. 4, since the resistance value hardly changes even when the erasure overwriting is repeated, the erased state can be maintained. Further, as described in FIG. 6, the writing action can be performed normally in the writing actions thereafter.

On the other hand, upon performing the programming action by selecting the memory cell in the array in random order, if the programming target variable resistance element is in the programmed state, the programmed state is brought to the erased state and further brought to the programmed state by applying the programming voltage pulse after having applied the erasing voltage pulse, and the program overwriting does not occur, thus the resistance state of the programming target variable resistance element is maintained in the programmed state. Further, if the programming target variable resistance element is in the erased state, although the erased state is brought to the erased state and further to the programmed state by applying the programming voltage pulse after having once applied the erasing voltage pulse, the resistance value hardly changes even when the erasure overwriting is repeated, and the programming can be performed normally by the application of the programming voltage pulse thereafter, so that the programming is performed normally.

That is, when the programming action is to be performed, by applying the programming voltage pulse after having once applied the erasing voltage pulse regardless of the resistance state of the variable resistance element, the overwriting occurs only in the erasure overwriting even if the writing voltage pulse is applied sequentially, and data is retained without any occurrence of abnormal deterioration of the resistance value.

In the above writing action, since the erasing voltage pulse is always applied once regardless of the resistance state of the writing target variable resistance element, time for applying the erasing voltage pulse is required in the case of the programming action. However, since the time required for the erasing action of the variable resistance element represented by the metal oxide variable resistance element is a few 10 nsec or less, which is short, it can be performed in a sufficiently short period of time compared to a flash memory which requires a few μsec or more for the programming action and a few msec or more for the erasing action. Due to this, the device of the present invention is capable of performing the erasing action in a bit unit even without using the byte unit or the block unit in performing the erasing action, and compared to a flash memory, it has a high performance not only in its high-speed operation but also the random accessibility.

[Second Embodiment]

In the above device of the present invention, the problem of the program overwriting is avoided and the transition to the programmed state without an abnormal decrease in the resistance value is enabled by applying the programming voltage pulse after having applied the erasing voltage pulse. However, in the programming action, even in the case where the programming voltage pulse is applied to the variable resistance element in the erased state, since the variability occurs in the resistance properties of the programmed states due to the variability in the element properties or the variability in the application voltage or application current, there may be a case in which the resistance value cannot be programmed to a desired resistance range.

To deal with this, in the present embodiment, after having applied the programming voltage pulse, a verifying action of verifying whether the resistance property of the variable resistance element after the programming is within the desired resistance distribution range is performed, and in this programming verifying action, in a case where the resistance property after the programming is determined as not being within the desired resistance distribution range, the programming is controlled such that the resistance property is brought to be within the desired resistance distribution range while the erasing voltage pulse and the second programming voltage pulse are applied again to avoid the program overwriting.

Figure 8:
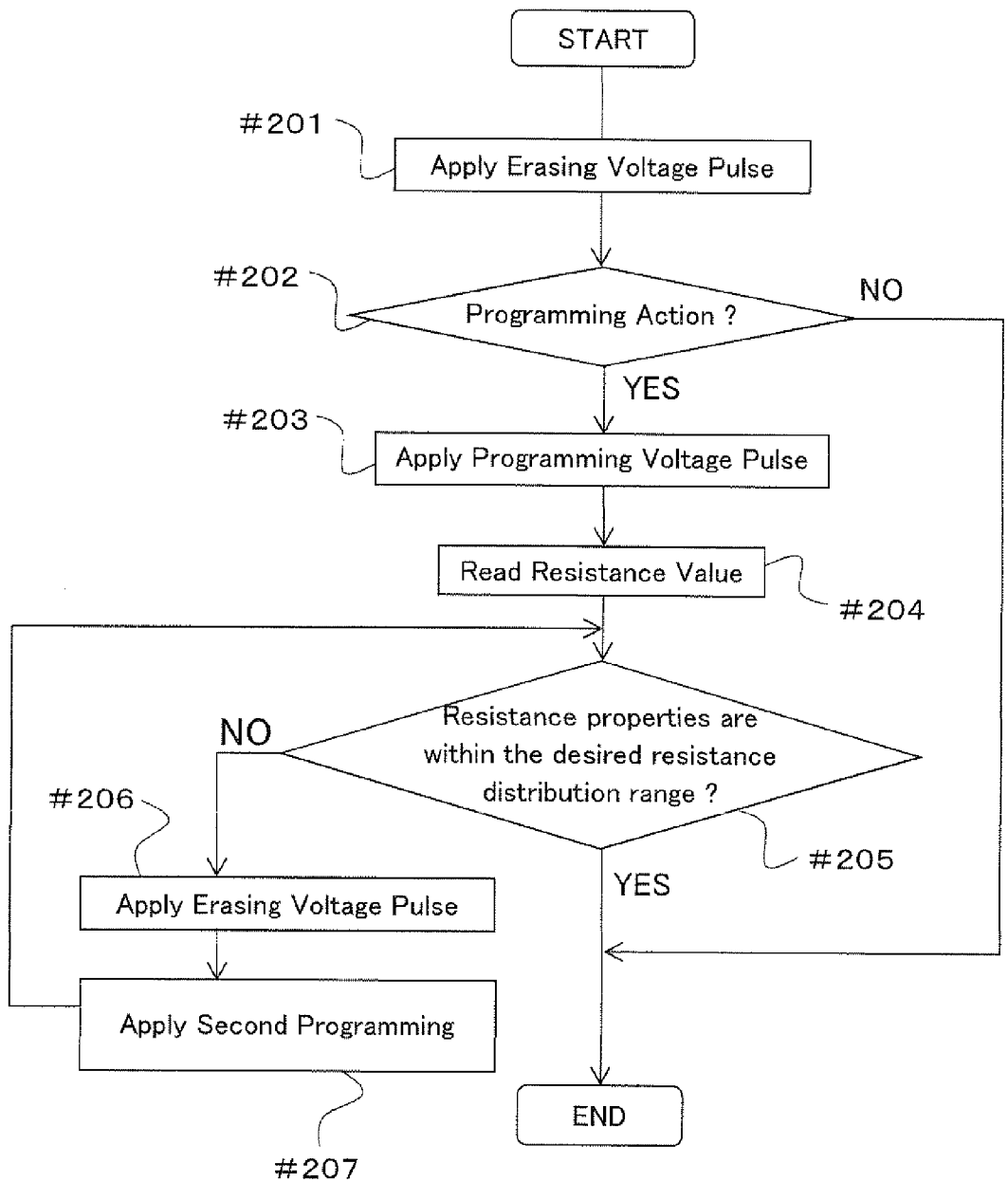
FIG. 8 is a flowchart showing a method of a writing action according to a second embodiment of the present invention.

Hereinafter, the writing action according to the present embodiment will be described with reference to a flowchart of FIG. 8.

Firstly, similar to the erasing action and the programming action of the first embodiment, the erasing voltage pulse is applied to the writing target variable resistance element regardless of the resistance state of the variable resistance element (step #201), and thereafter, the programming voltage pulse is applied to the programming target variable resistance element (step #203). At this time, in a case where there is a plurality of writing target variable resistance elements, the erasing voltage pulse may be applied collectively by selecting all of the plurality of writing target variable resistance elements, and the erasing voltage pulse may be applied independently by sequentially selecting a writing target variable resistance element. Alternatively, the erasing voltage pulse may be applied collectively by selecting the writing target variable resistance elements for every word line or bit line.

Thereafter, the resistance values of all of the programming target variable resistance elements are read (step #204), and a determination is made on whether or not the resistance properties in the programmed state are within the desired resistance distribution range (step #205). At this time, in the case of having a plurality of resistance states as the programmed state, the determination on whether or not the resistance property is within the desired resistance distribution range is made with a determination reference being whether the programmed state is a particular resistance value or more, or within a particular range from one resistance value to another resistance value.

In this determination, in a case where a programming target variable resistance element having its resistance property not within the desired resistance distribution range exists (diverting to NO in step #205), the programming is performed again, and the resistance property is controlled to be brought to be within the desired resistance distribution range.

At this time, when the programming voltage pulse is applied again to the variable resistance element in the programmed state, since the variable resistance element is program overwritten, the programmed state is not normal, and there is a possibility that the programming failure may occur. Due to this, the erasing voltage pulse is applied to the programming target variable resistance element that does not have the resistance property being within the desired resistance distribution range (step #206), and after having transitioned the variable resistance element to the erased state, the second programming voltage pulse is applied afresh (step #207).

Then, the application of the erasing voltage pulse and the application of the second programming voltage pulse are repeated until the resistance properties of all of the programming target variable resistance elements are brought to be within the desired resistance distribution range.

Figure 9:
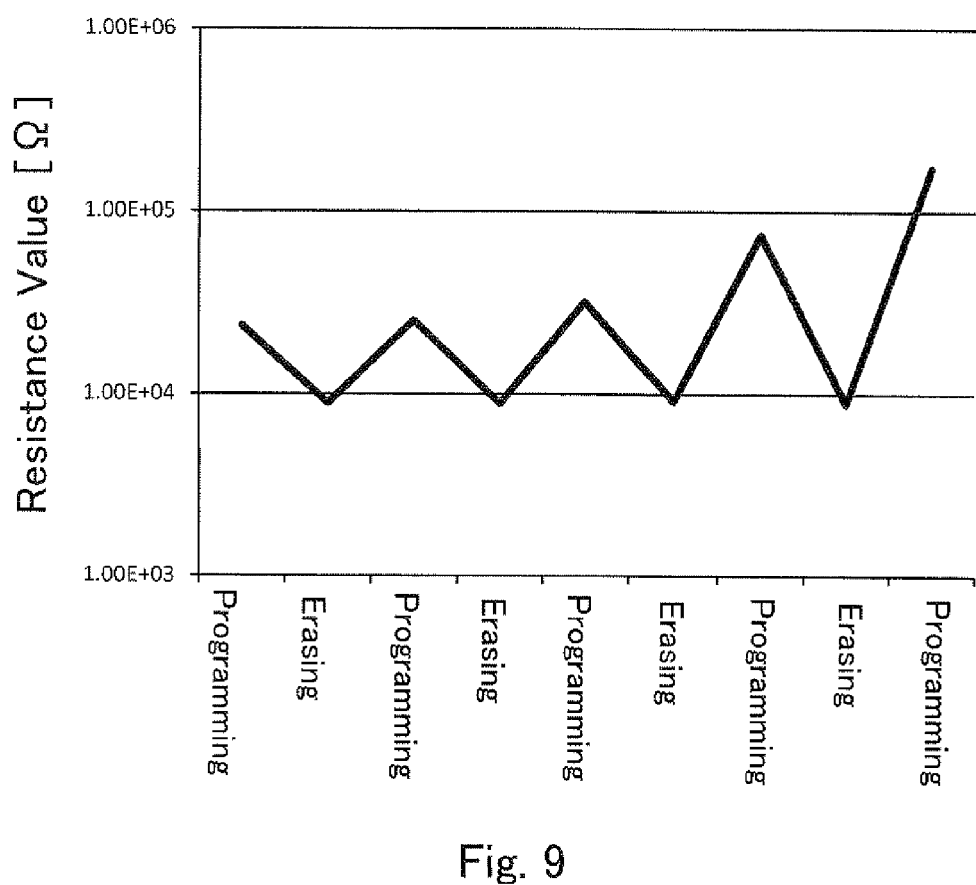
FIG. 9 is a diagram showing a change in a resistance value in a variable resistance element to which a programming could not have been performed by one application of the programming voltage pulse when the erasing voltage pulse and a second programming voltage pulse are further applied alternately for plural times.

FIG. 9 shows the transition of the resistance value of a variable resistance element, in which the programming failure had occurred in the one-time application of the programming voltage pulse and that had not been able to transition to the programmed state, in the case of repeating the applications of the erasing voltage pulse and the second programming voltage pulse until the resistance property is brought to be within the desired resistance distribution range of the programmed state (which is herein 100 kΩ or more) by the above method. As shown in FIG. 9, even if the programmed state could not have been reached by one time of the programming action, by repeating the applications of the erasing voltage pulse and the second programming voltage pulse, the resistance value can be raised to the desired resistance distribution range.

Further, in the case of repeatedly applying the second programming voltage pulse to the programming target variable resistance element whose resistance property is not within the desired resistance distribution range after the application of the programming voltage pulse for the first time, it is preferable to set an absolute value of an application voltage of the second programming voltage pulse to be smaller than an absolute value of the application voltage of the programming voltage pulse in the first application, and thereafter increase the absolute value of the application voltage in steps each time the application of the second programming voltage pulse is repeated.

Figure 12:
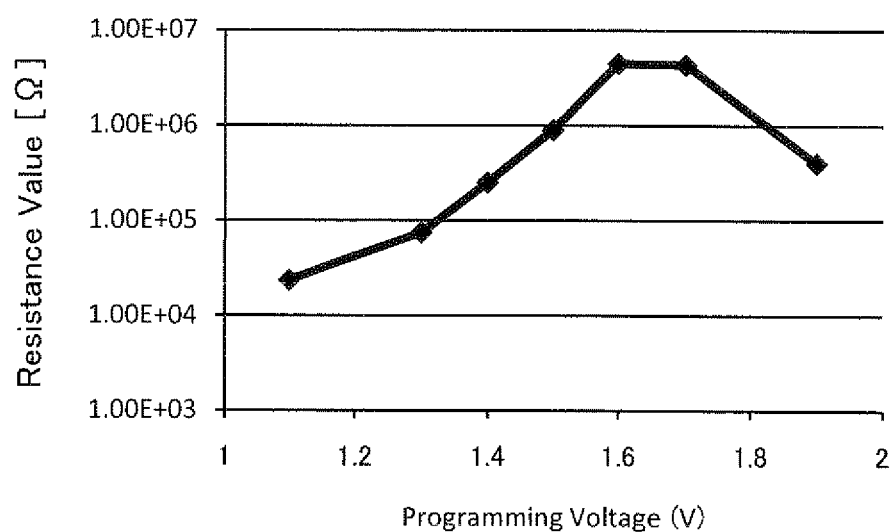
FIG. 12 is a resistance hysteresis curve showing a relationship between an absolute value of the writing voltage pulse applied to the variable resistance element and the resistance value after the application of the writing voltage pulse.

Due to having a resistance hysteresis curve as shown in FIG. 12 as a property of the variable resistance element, the resistance value after the programming changes greatly depending on the programming voltage applied to the variable resistance element, and for some variable resistance elements, a subtle difference in the application voltage gives rise to a great difference in the electric resistance. The resistance hysteresis curve of FIG. 12 has the variability for each element, and even if an identical programming voltage pulse is applied, since the difference in the voltage or current that is actually applied occurs for each element clue to the position of the variable resistance element within the array, there is a possibility that a variable resistance element having the resistance property that is not brought to be within the desired resistance distribution range even by the application of the identical programming voltage pulse exists.

In such a case, even if the applications of the erasing voltage pulse and the programming voltage pulse are repeated, so long as all of the absolute values of the applied programming voltage pulses are identical, it is difficult to control the resistance property in the programmed state of the variable resistance element to be within the desired resistance distribution range.

However, the absolute value of the second programming voltage pulse that is repeatedly applied may be set smaller than the programming voltage pulse of the first time in the first time application of the second programming voltage pulse, and thereafter, by increasing the same in steps in the application of the second programming voltage pulse for the second and subsequent times, the programming can be controlled stably by taking the property variability of each element into consideration.

Figure 10:
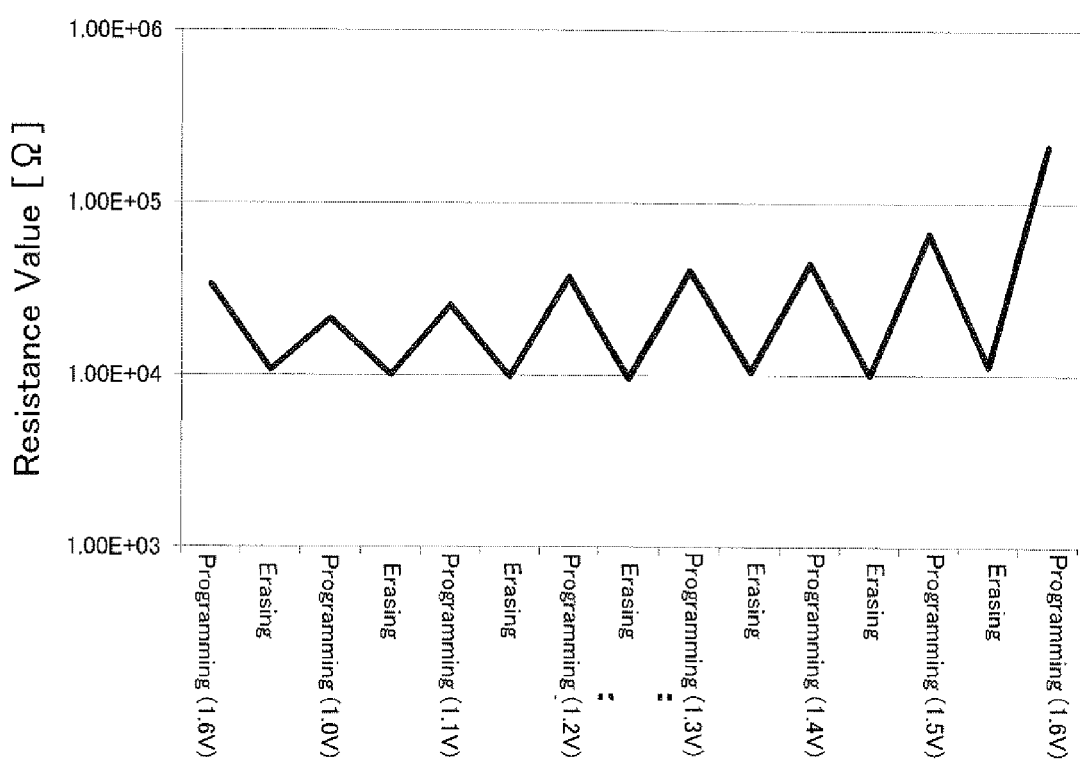
FIG. 10 is a diagram showing a change in the resistance value in the variable resistance element to which the programming could not have been performed by one application of the programming voltage pulse when the erasing voltage pulse and the second programming voltage pulse are further applied alternately for plural times while increasing an application voltage of the second programming voltage pulse.

FIG. 10 shows the transition of the resistance value of a variable resistance element, in which the programming failure had occurred in the first-time application of the programming voltage pulse of 1.6 V and that had not been able to transition to the programmed state, in the case of repeating the applications of the erasing voltage pulse and the second programming voltage pulse while increasing the absolute value of the application voltage of the second programming voltage pulse in steps of 0.1 V from 1.0 V. As shown in FIG. 10, even if the programmed state could not have been reached by one time of the programming action, by repeating the applications of the erasing voltage pulse and the second programming voltage pulse while changing the application voltage of the second programming voltage pulse, the resistance value can surely be raised to the desired resistance distribution range (which is herein 100 kΩ or more).

Figure 11:
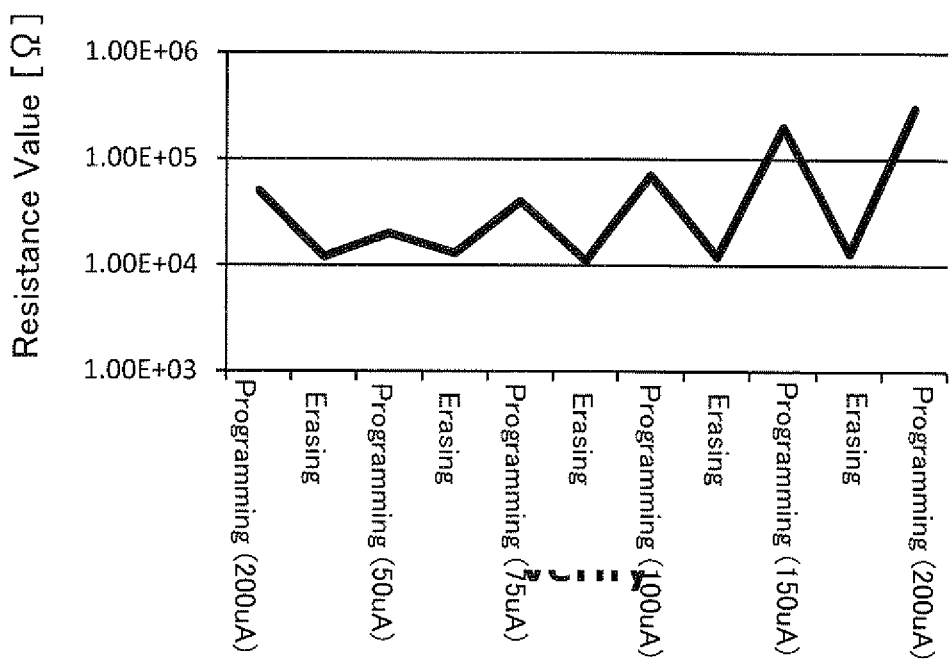
FIG. 11 is a diagram showing a change in the resistance value in the variable resistance element to which the programming could not have been performed by one application of the programming voltage pulse when the erasing voltage pulse and the second programming voltage pulse are further applied alternately for plural times while increasing a programming current accompanying the pulse application.

Note that, although the programming is performed in FIG. 10 by increasing the application voltage of the second programming voltage pulse in steps, the programming is possible by increasing the application current in steps. FIG. 11 shows the transition of the resistance value of a variable resistance element, to which the programming voltage pulse had been applied under a state in which the programming current is limited to 200 μA but that could not have transitioned to the programmed state, in the case of repeating the applications of the erasing voltage pulse and the second programming voltage pulse while the programming current upon the application of the second programming voltage pulse is increased in steps from 50 μA. Note that, the values of the application voltage and application current as well as the resistance values of the second programming voltage pulses in FIG. 10 and FIG. 11 are mere examples for describing the present embodiment, and do not limit the property of the variable resistance elements.

Hereinafter, other embodiments will be described.

(1) In the above embodiment, the detailed description has been given taking the case of performing writing of one memory cell in the memory cell array 100 of FIG. 1 as an example, however, the present invention is not limited by the configuration of the memory cell array, and may be adapted to an arbitrary memory array including a variable resistance element formed of metal oxide in a memory cell, and a desired number of memory cells.

(2) Although specific values are given as the electric resistances in the low resistance state and the high resistance state in FIG. 2, these are examples of electric resistance values of the variable resistance element in the present embodiment, and do not limit the property of the variable resistance element. The present invention can be adapted to any element having a plurality of different electric resistance states of two states or more. Further, the voltage values of the read voltages used for the programming action and the erasing action and the writing voltage pulses are specific examples for describing the present invention, and do not limit the property of the variable resistance element. Further, in performing the writing action of the present embodiment, although the voltage pulse is applied from the lower electrode and have the upper electrode to be at the reference voltage in performing the programming action, and the voltage pulse is applied from the upper electrode and have the lower electrode to be at the reference voltage in performing the erasing action, these do not limit the property of the variable resistance element; depending on the material used for the variable resistance element, the electrode to which the voltage pulse is applied and the electrode to which the reference voltage is applied may be opposite in the programming action and the reading action.

(3) In the above embodiment, although a driving method, typically referred to as bipolar operation, in which the resistance value of the variable resistance element is increased (high resistance state) or decreased (low resistance state) by applying, to the variable resistance element, the programming voltage pulse and the erasing voltage pulse that have opposite polarities has been exemplified, the present invention is not limited to the bipolar operation. Even with a driving method, referred to as a unipolar operation, in which the resistance value of the variable resistance element is increased (high resistance state) or decreased (low resistance state) by applying, to the variable resistance element, the programming voltage pulse and the erasing voltage pulse having the same polarity, the present invention can be adapted so long as the element includes the overwriting durability against the application of the writing voltage pulse of either the programming voltage pulse or the erasing voltage pulse. In such a case, a diode may be used as the current controlling element. At this time, one of anode and cathode of the diode is connected to one terminal of the variable resistance element, the other is connected to the word line, and the other terminal of the variable resistance element not connected to the diode is connected to a bit line. The relationship between the word lines and the bit lines may be the opposite.

(4) Further, in the above embodiment, although binary variable resistance elements having two states of the low resistance state and the high resistance state as the resistance states have been described in detail, the present invention is not limited to the binary variable resistance elements. It can be adapted to variable resistance elements that can retain three or more resistance states. In such a case, among the three or more resistance states, the lowest resistance state is the erased state, and the other states are the programmed state. In the programming action, after having applied the erasing voltage pulse, the first programming voltage pulse that is controlled so that the resistance property is to be within the desired resistance distribution range of the resistance state is applied. Thereafter, as shown in the above second embodiment, the application of the erasing voltage pulse and the application of the second programming voltage pulse are repeated until the resistance property of the programming target variable resistance element is brought to be within the desired resistance distribution range of the resistance state. As shown in FIG. 10 or FIG. 11, since when the application voltage or the application current of the second programming voltage pulse is increased in steps, the resistance value of the variable resistance element gradually increases, the programming can be performed to an arbitrary programmed state by completing the programming action upon reaching the desired resistance distribution range.

(5) In the above embodiments, although the case of the variable resistance element using hafnium oxide as the variable resistor has been described as the example, the present invention is not limited to this. As for the property of the metal oxide variable resistance element, the state in which the insulating property is high in the metal oxide is the high resistance state, and a dielectric breakdown occurs as a result of continuously applying voltages to the insulating film. This is an inevitable phenomenon that occurs sooner or later by application of electric stress as long as voltages are continuously applied to the insulating film although the applying time and voltage characteristics vary among elements. Due to this, in the programming action, etc., when the voltage that would cause the high resistance state element to further be in the high resistance is kept applied (overwritten), the dielectric breakdown occurs sooner or later, and the resistance is lowered. The programming scheme of the present invention is useful in materials having such a property. Accordingly, the metal oxide that can be used as the variable resistor in the present invention is not limited to the oxide of Hf; and the present invention can be adapted with e.g., the oxynitride of Hf, or a metal oxide or oxynitride of at least one of Al, Ni, Co, Ta, Zr, W, Ti, Cu, V, Zn and Nb. Moreover, if one of the high resistance state with the highest resistance value and the low resistance state with the lowest resistance value among the respective resistance states of the variable resistance element has the above overwriting durability, the present invention can be adapted to the element with the resistance state of the side having the overwriting durability as the erased state.

The present invention can be used in semiconductor memory devices, and especially can be used in a non-volatile semiconductor memory device configured by including variable resistance elements in which the resistance state transitions by the application of the electric stress, and uses the resistance state after the transition for storing information.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device comprising:
   a memory cell array configured of memory cells, a plurality of which is arranged respectively in a row direction and a column direction, each memory cell including a variable resistance element in which an electrode is supported at each of two terminals of a variable resistor, a resistance state is defined by a resistance property between the two terminals and transitions between two or more different resistance states by applying electric stress between the two terminals, and one resistance state after the transition is used for storing information, wherein
   in a random writing of one or more selected memory cells in the memory cell array,
   either an erasing action or a programming action is performed on each of the selected memory cells,
   in the erasing action, an erasing voltage pulse for transitioning the resistance states of the variable resistance elements of the selected memory cells to an erased state having a lowest resistance value is applied to the selected memory cells, regardless of the resistance states of the variable resistance elements of the selected memory cells, and
   in the programming action, the erasing voltage pulse is applied to the selected memory cells, and a first programming voltage pulse for transitioning the resistance states of the variable resistance elements of the selected memory cells from the erased state to a predetermined resistance state is applied to the selected memory cells, regardless of the resistance states of the variable resistance elements of the selected memory cells.

2. The semiconductor memory device according to claim 1, wherein
   an initial verifying action of reading the resistance states of the variable resistance elements of the selected memory cells is not performed prior to performing the erasing action or the programming action.

3. The semiconductor memory device according to claim 1, further comprising:
   a verification section that performs, after having performed the programming action, a verifying action of verifying whether or not the resistance properties of the variable resistance elements of the selected memory cells are within a resistance distribution range of the predetermined resistance state, wherein
   in the verifying action, in a case where the memory cell of which the resistance property of the variable resistance element is outside the resistance distribution range of the predetermined resistance state is detected among the selected memory cells,
   a second programming action is repeatedly performed until the resistance property of the variable resistance element of the memory cell that is outside the resistance distribution range is brought to be within the resistance distribution range of the predetermined resistance state, and
   in the second programming action, the erasing voltage pulse is applied to the memory cell and a second programming voltage pulse for transitioning the resistance state of the variable resistance element of the memory cell that is outside the resistance distribution range from the erased state to the predetermined resistance state is applied to the memory cell, regardless of the resistance state of the variable resistance element of the memory cell that is outside the resistance distribution range.

4. The semiconductor memory device according to claim 3, wherein
   in the case where the second programming action is repeated for a plurality of times,
   in the second programming action for a first time,
   the second programming voltage pulse is set to have a smaller absolute value of a voltage amplitude than that of the first programming voltage pulse, or to have a smaller amount of current flowing in the variable resistance element when the second programming voltage pulse is applied than when the first programming voltage pulse is applied, and
   in the second programming action for second and subsequent times,
   the absolute value of the voltage amplitude of the second programming voltage pulse or the amount of current flowing in the variable resistance element when the second programming voltage pulse is applied is increased in steps as a number of times the second programming action is performed increases.

5. The semiconductor memory device according to claim 1, wherein
   each of the memory cells includes a current controlling element connected to the electrode on one terminal of the variable resistor of the variable resistance element, and
   the current controlling element is a transistor having either a source or a drain connected to the electrode on the one terminal of the variable resistor.

6. The semiconductor memory device according to claim 1, wherein
   each of the memory cells includes a current controlling element connected to the electrode on one terminal of the variable resistor of the variable resistance element, and
   the current controlling element is a diode element having either an anode or a cathode connected to the electrode on the one terminal of the variable resistor.

7. The semiconductor memory device according to claim 1, wherein
the variable resistor is configured by including a metal oxide or oxynitride of at least one of Al, Hf, Ni, Co, Ta, Zr, W, Ti, Cu, V, Zn and Nb.

* * * * *